(12) United States Patent
Do et al.

(10) Patent No.: US 8,168,458 B2
(45) Date of Patent: May 1, 2012

(54) SEMICONDUCTOR DEVICE AND METHOD OF FORMING BOND WIRES AND STUD BUMPS IN RECESSED REGION OF PERIPHERAL AREA AROUND THE DEVICE FOR ELECTRICAL INTERCONNECTION TO OTHER DEVICES

(75) Inventors: Byung Tai Do, Singapore (SG); Reza A. Pagaila, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 518 days.

(21) Appl. No.: 12/329,800

(22) Filed: Dec. 8, 2008

(65) Prior Publication Data
US 2010/0140783 A1 Jun. 10, 2010

(51) Int. Cl.
*H01L 21/00* (2006.01)

(52) U.S. Cl. ............ 438/33; 438/68; 438/113; 438/114; 438/458; 438/460; 438/461; 438/462; 438/463; 438/464; 438/465

(58) Field of Classification Search ........................ None
See application file for complete search history.

(56) References Cited

U.S. PATENT DOCUMENTS

| 6,998,344 | B2 | 2/2006 | Akram et al. | |
|---|---|---|---|---|
| 7,307,348 | B2 | 12/2007 | Wood et al. | |
| 2003/0062631 | A1* | 4/2003 | Nemoto | 257/787 |
| 2003/0194860 | A1* | 10/2003 | Nemoto | 438/667 |
| 2005/0176233 | A1* | 8/2005 | Joshi et al. | 438/613 |
| 2006/0261446 | A1* | 11/2006 | Wood et al. | 257/621 |
| 2007/0023886 | A1 | 2/2007 | Hedler et al. | |
| 2007/0085189 | A1 | 4/2007 | Sunohara et al. | |
| 2007/0102801 | A1* | 5/2007 | Ishida et al. | 257/686 |
| 2008/0142945 | A1 | 6/2008 | Ha et al. | |
| 2008/0157303 | A1* | 7/2008 | Yang | 257/676 |
| 2009/0020890 | A1* | 1/2009 | Meguro | 257/778 |
| 2010/0072582 | A1* | 3/2010 | Chandra et al. | 257/659 |
| 2010/0140783 | A1* | 6/2010 | Do et al. | 257/692 |
| 2010/0145216 | A1* | 6/2010 | He et al. | 600/544 |
| 2010/0186991 | A1* | 7/2010 | Tajima et al. | 174/126.1 |

FOREIGN PATENT DOCUMENTS

| JP | 2003007909 A | * | 1/2003 |
|---|---|---|---|
| JP | 2003174120 A | * | 6/2003 |

* cited by examiner

*Primary Examiner* — David E Graybill
(74) *Attorney, Agent, or Firm* — Robert D. Atkins; Patent Law Group: Atkins & Associates, P.C.

(57) ABSTRACT

A semiconductor wafer contains a plurality of semiconductor die each having a peripheral area around the die. A recessed region with angled or vertical sidewall is formed in the peripheral area. A conductive layer is formed in the recessed region. A first stud bump is formed over a contact pad of the semiconductor die. A second stud bump is formed over the first conductive layer within the recessed region. A bond wire is formed between the first and second stud bumps. A third stud bump is formed over the bond wire and first stud bump. A dicing channel partially formed through the peripheral area. The semiconductor wafer undergoes backgrinding to the dicing channel to singulate the semiconductor wafer and separate the semiconductor die. The semiconductor die can be disposed in a semiconductor package with other components and electrically interconnected through the bond wire and stud bumps.

25 Claims, 10 Drawing Sheets

SEMICONDUCTOR DEVICE AND METHOD OF FORMING BOND WIRES AND STUD BUMPS IN RECESSED REGION OF PERIPHERAL AREA AROUND THE DEVICE FOR ELECTRICAL INTERCONNECTION TO OTHER DEVICES

FIELD OF THE INVENTION

The present invention relates in general to semiconductor devices and, more particularly, to a semiconductor device having bond wires and stud bumps formed in a recessed region of a peripheral area around the device for electrical interconnection to other devices.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In package-in-package (PiP) and package-on-package (PoP) arrangements, the vertical electrical interconnect between components is typically accomplished with conductive through silicon vias (TSV) or through hole vias (THV). In most TSVs and THVs, the sidewalls and bottom-side of the via are conformally plated with conductive materials to enhance adhesion. The TSVs and THVs are then filled with another conductive material, for example, by copper deposition through an electroplating process. The TSV and THV formation typically involves considerable time for the via filling, which reduces the unit-per-hour (UPH) production schedule. The equipment need for electroplating, e.g. plating bath, and sidewall passivation increases manufacturing cost. In addition, voids may be formed within the vias, which causes defects and reduces reliability of the device. TSV and THV can be a slow and costly approach to make vertical electrical interconnections in semiconductor packages.

SUMMARY OF THE INVENTION

A need exists to provide vertical electrical interconnect between components of a semiconductor package without forming conductive vias. Accordingly, in one embodiment, the present invention is a method of making a semiconductor device comprising the steps of providing a semiconductor wafer having a plurality of semiconductor die with a peripheral area around the semiconductor die, and forming a recessed region in the peripheral area. The recessed region has an angled or vertical sidewall. The method further includes the steps of forming a first conductive layer in the recessed region, forming a first stud bump over a contact pad of the semiconductor die, forming a second stud bump over the first conductive layer within the recessed region, forming a bond wire between the first and second stud bumps, forming a third stud bump over the bond wire and first stud bump, forming an encapsulant over the first conductive layer, bond wire, and first, second, and third stud bumps, forming a dicing channel partially through the peripheral area, and removing a portion of a backside of the semiconductor wafer to the dicing channel to singulate the semiconductor wafer and separate the semiconductor die.

In another embodiment, the present invention is a method of making a semiconductor device comprising the steps of providing a semiconductor wafer having a plurality of semiconductor die with a peripheral area around the semiconductor die, forming a recessed region in the peripheral area, forming a conductive layer in the recessed region, forming a first stud bump over a contact pad of the semiconductor die, forming a second stud bump over the conductive layer within the recessed region, forming a bond wire between the first and second stud bumps, forming an encapsulant over the conductive layer, bond wire, and first and second stud bumps, and singulating the semiconductor wafer through the peripheral area to separate the semiconductor die.

In another embodiment, the present invention is a method of making a semiconductor device comprising the steps of providing a semiconductor wafer having a plurality of semiconductor die with a peripheral area around the semiconductor die, forming a recessed region in the peripheral area, forming a first stud bump over a contact pad of the semiconductor die, forming a second stud bump within the recessed region, forming a bond wire between the first and second stud bumps, and singulating the semiconductor wafer through the peripheral area to separate the semiconductor die.

In another embodiment, the present invention is a semiconductor device comprising a semiconductor die having a contact pad. A peripheral area is provided around the semiconductor die. A recessed region is formed in the peripheral area. A conductive layer is formed in the recessed region. A first stud bump is formed over the contact pad of the semiconductor die. A second stud bump is formed over the conductive layer within the recessed region. A bond wire is formed between the first and second stud bumps. An encapsulant is formed over the conductive layer, bond wire, and first and second stud bumps.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electrolytic and electroless plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
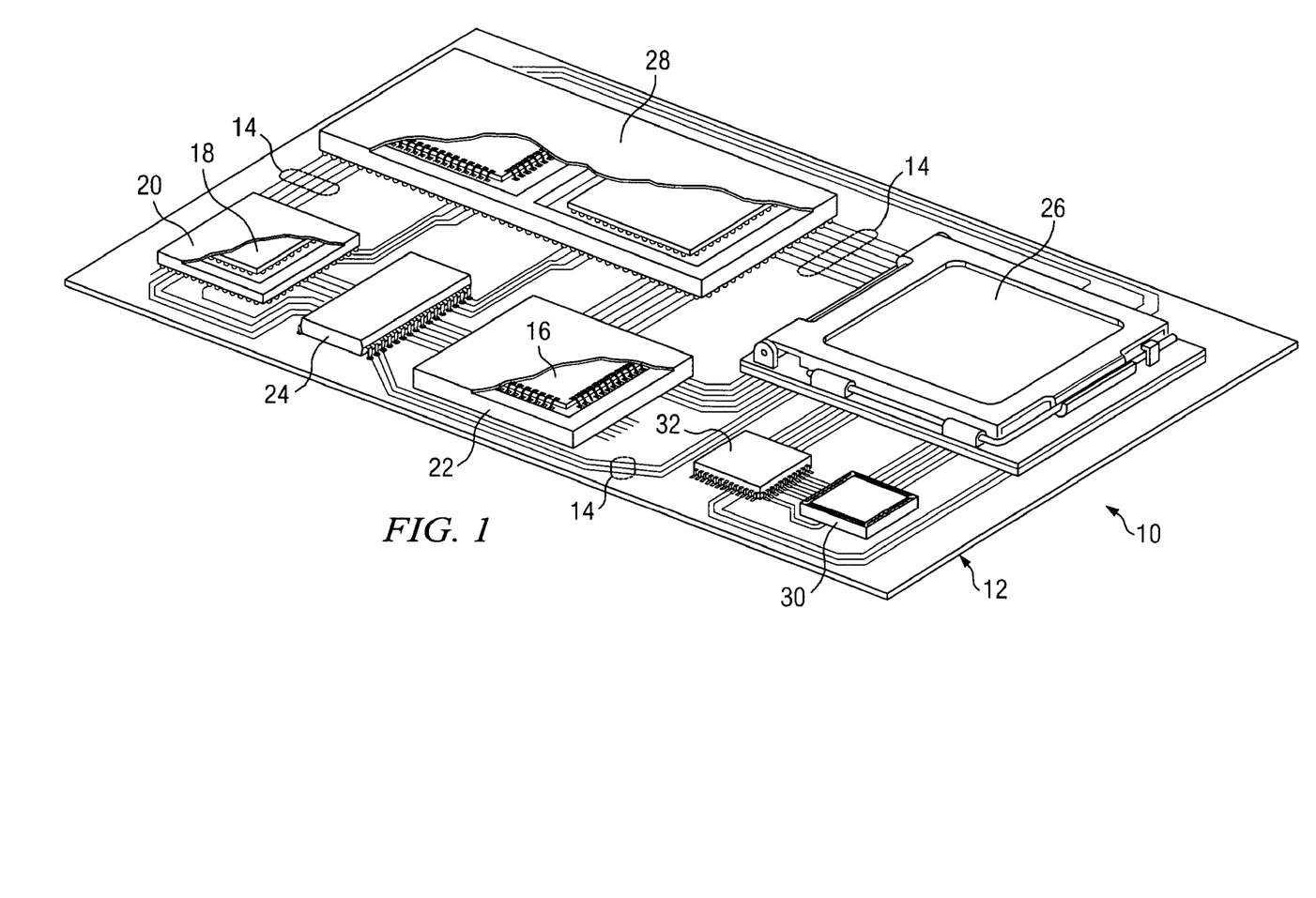
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
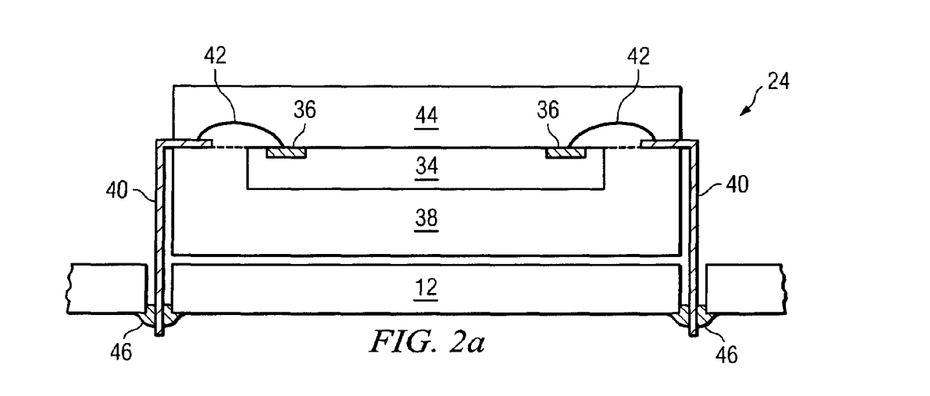
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
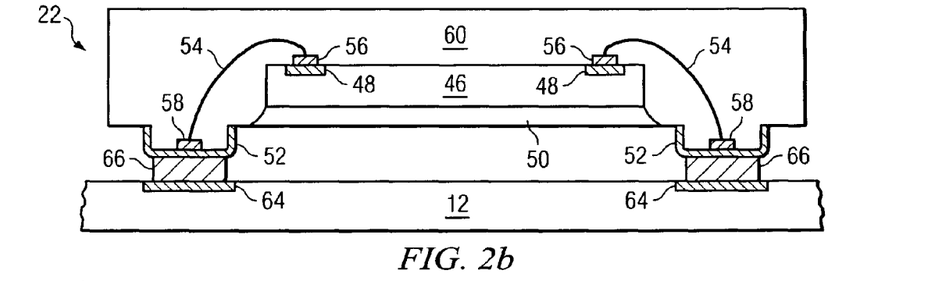

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active area containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active area of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
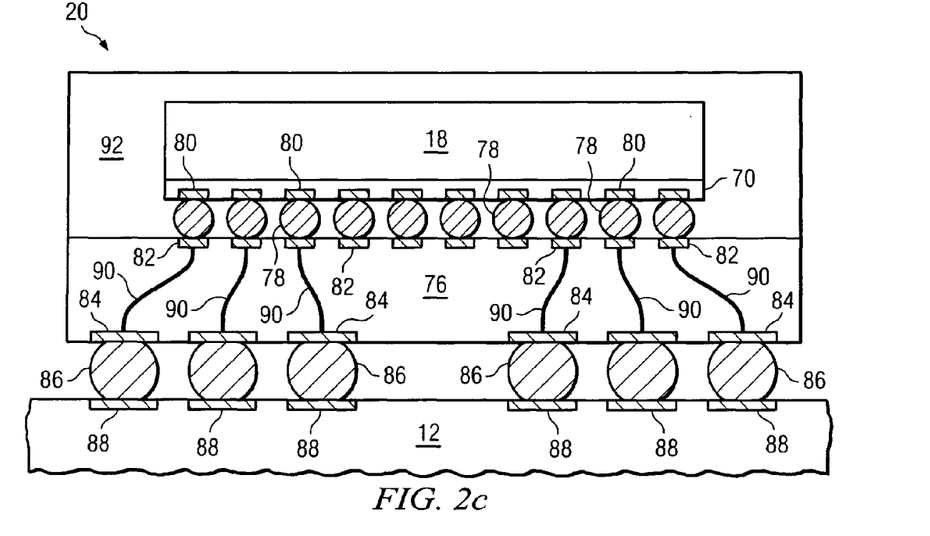

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
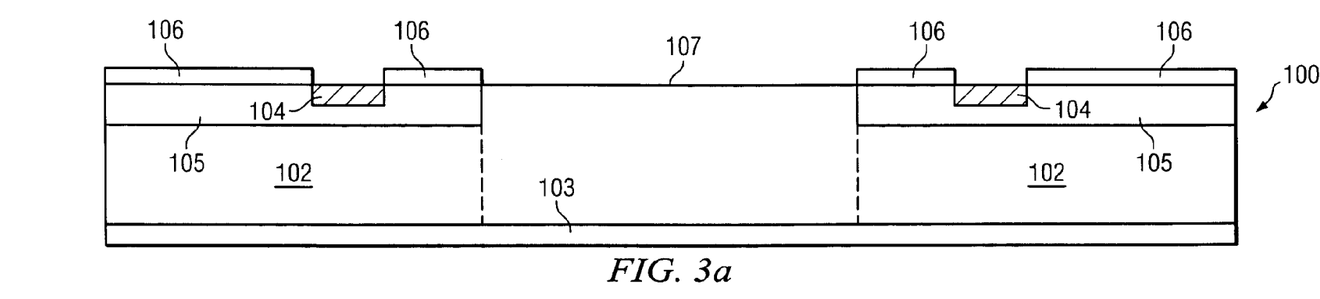
FIGS. 3a-3j illustrate a process of forming bond wires and stud bumps in a recessed region of a peripheral area around the die.

FIGS. 3a-3j illustrate a process of forming bond wires and stud bumps in a recessed region in a peripheral area around a semiconductor die for electrical interconnection to other devices. FIG. 3a illustrates a semiconductor wafer 100 made with silicon, germanium, gallium arsenide, indium phosphide, or other bulk semiconductor material 102. Wafer 100 typically ranges from 50-250 micrometers (μm) in thickness. For thick wafers, the wafer may be mounted to dicing tape 103. In the case of thin wafers, the wafer can also be mounted to a temporary carrier or substrate.

A plurality of semiconductor die is formed on wafer 100 using semiconductor manufacturing processes described above. Each semiconductor die may contain analog or digital circuits implemented as active devices, integrated passive devices (IPD), conductive layers, signal traces, and dielectric layers in active region 105. The IPDs include inductors, capacitors, and resistors. The active and passive electrical components are electrically connected to form functional electrical circuits according to the electrical design and function of the die. The semiconductor die are each separated by a peripheral area or saw street 107.

A portion of the wafer bulk material is removed by an etching process to form recessed regions. An electrically conductive material, such as Al, Cu, Sn, Ni, Au, or Ag, is deposited in the recessed regions using PVD, CVD, evaporation, electrolytic plating, electroless plating, screen printing, or other suitable metal deposition process to form contact pads 104. Contact pads 104 are made suitable for wire bond connections. Contact pads 104 further electrically connect to signal traces and other conductive layers in active region 105 according to the electrical design of the die.

A passivation layer 106 is deposited over active regions 105. Passivation layer 106 can be silicon dioxide ($SiO_2$), silicon nitride ($Si_3N_4$), silicon oxynitride (SiON), tantalum pentoxide ($Ta_2O_5$), aluminum oxide ($Al_2O_3$), polyimide (PI), benzocyclobutene (BCB), polybenzoxazole (PBO), or other suitable material having insulating properties. A portion of passivation layer 106 is removed by an etching process to expose contact pads 104. Saw street 107 is about 90 μm in width to provide separation between the semiconductor die on wafer 100 for formation of stud bumps and dicing operations as described below.

Figure 3B:
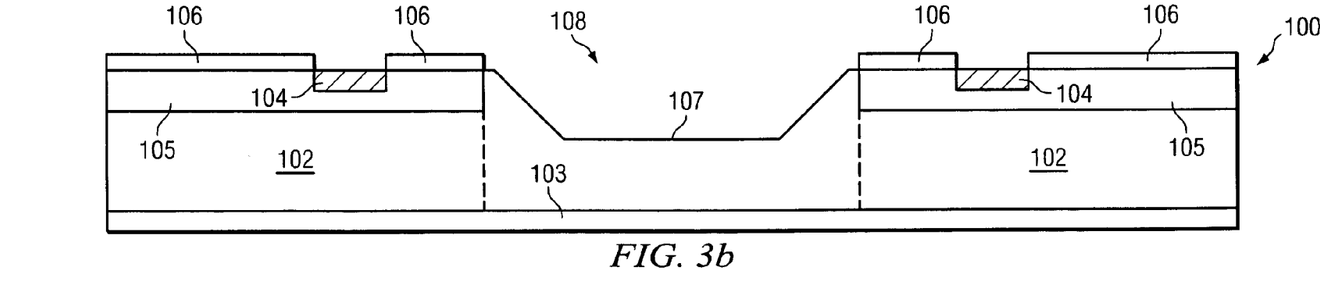
Figure 3C:
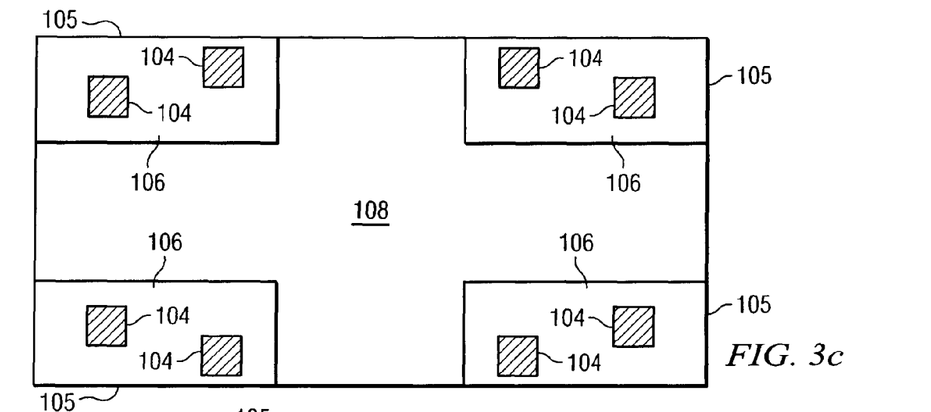

In FIG. 3b, a trench or recessed region 108 is formed in saw street 107 by chemical etching, mechanical cutting, or laser cutting. In one embodiment, recessed region 108 has sidewalls which are angled to 45 degrees with respect to the surface of wafer 100. Alternatively, the sidewalls of recessed region 108 can be vertical. The width of recessed region 108 is about 50-100 micrometers (μm). The depth of recessed region 108 ranges from 25 to 100 μm. FIG. 3c shows a top view of an intersection of recessed regions 108 separating active regions 105 of four semiconductor die. Each semiconductor die active region 105 is covered by passivation layer 106 and contains contact pads 104.

Figure 3D:
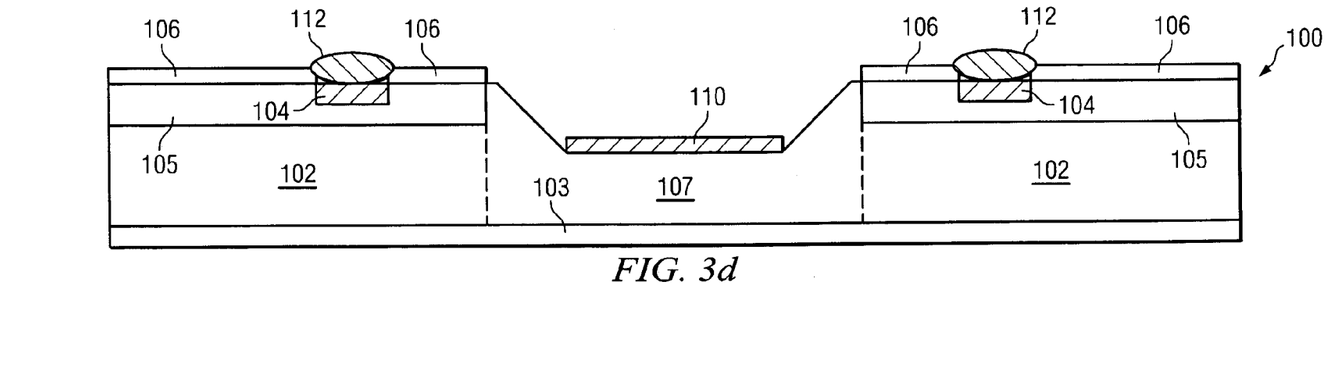

In FIG. 3d, an electrically conductive layer 110 is patterned and deposited in recessed region 108. Conductive layer 110 is wire-bondable and formed using PVD, CVD, sputtering, evaporation, electrolytic plating, electroless plating, screen printing, or other suitable metal deposition process. The conductive layer 110 can be Al, Cu, Sn, Ni, Au, Ag, or other suitable material.

Figure 3E:
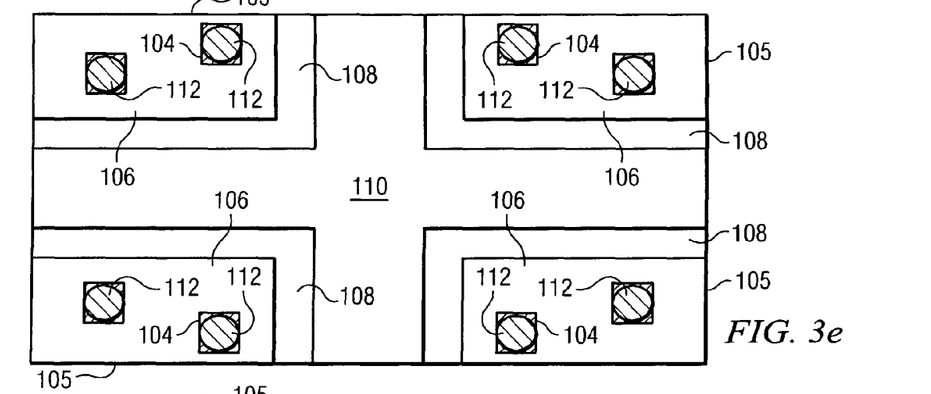

Stud bumps or ball bonds 112 are formed on contact pads 104 using PVD, CVD, sputtering, evaporation, electrolytic plating, electroless plating, screen printing, or other metal deposition process suitable for wire bonding. Stud bumps 112 can be Al, Cu, Sn, Ni, Au, Ag, or other suitable material. FIG. 3e shows a top view of stud bumps 112 formed on contact pads 104 in each active region 105.

Figure 3F:
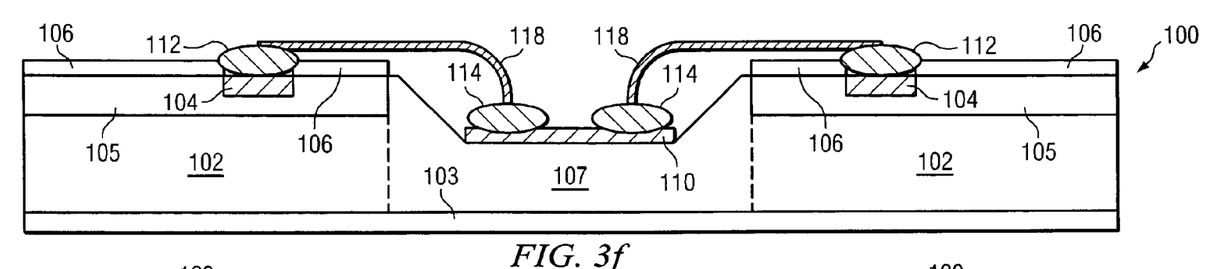
Figure 3G:
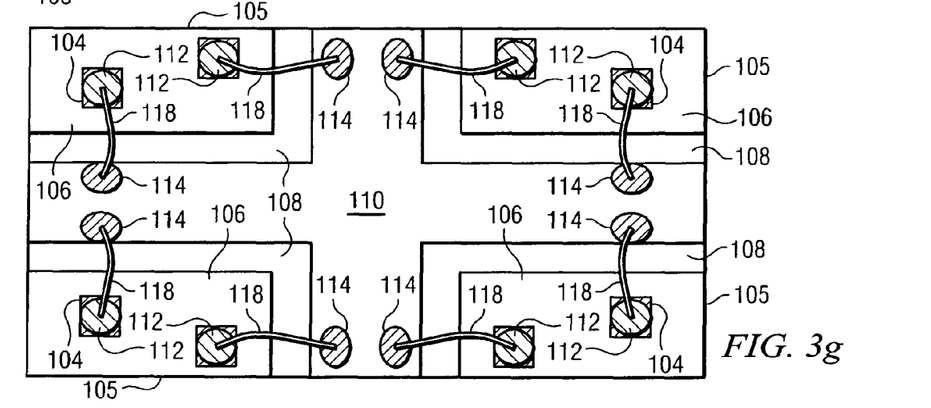

In FIG. 3f, stud bumps or ball bonds 114 are formed on conductive layer 110 using PVD, CVD, sputtering, evaporation, electrolytic plating, electroless plating, screen printing, or other metal deposition process suitable for wire bonding. Stud bumps 114 can be Al, Cu, Sn, Ni, Au, Ag, or other suitable material. Bond wires 118 are formed between stud bumps 112 and 114 to electrically connect conductive layer 110 to contact pads 104. Wire bonding is a low-cost, mature, stable technology for forming the electrical connection between conductive layer 110 to contact pads 104. In one embodiment, the electrical connection between conductive layer 110 and contact pads 104 utilizes reverse standoff stitch bonding (RSSB). FIG. 3g shows a top view of bond wires 118 formed between stud bumps 112 and 114 to electrically connect conductive layer 110 to contact pads 104 for each active region 105.

Figure 3H:
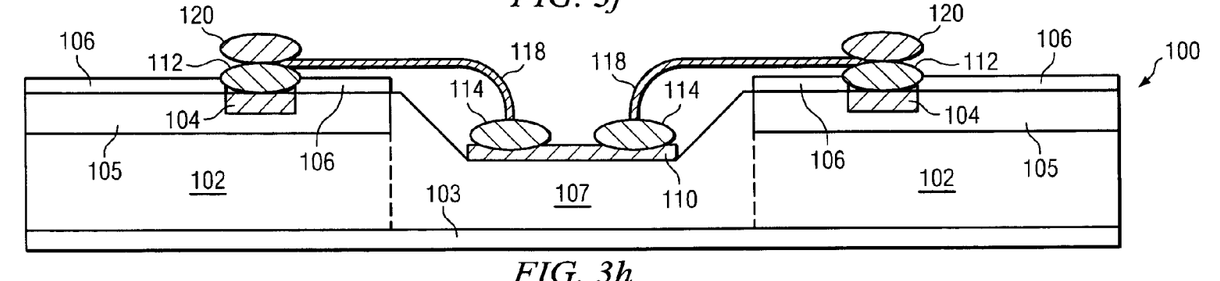

In FIG. 3h, stud bumps or ball bonds 120 are formed on bond wires 118 and stud bumps 112 using PVD, CVD, sputtering, evaporation, electrolytic plating, electroless plating, screen printing, or other metal deposition process suitable for wire bonding. Stud bumps 120 can be Al, Cu, Sn, Ni, Au, Ag, or other suitable material. Stud bumps 112, 114, and 120 are each about 30 μm in diameter.

Figure 3I:
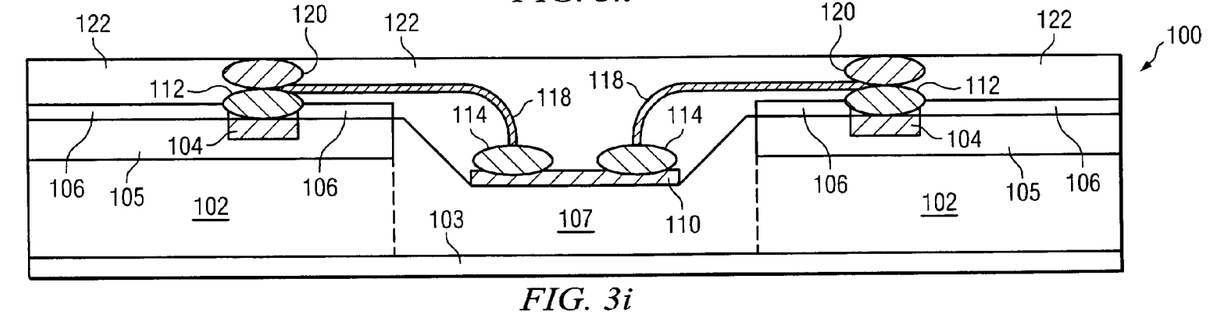

In FIG. 3i, an insulating layer 122 is formed over passivation layer 106, conductive layer 110, bond wires 120, and stud bumps 112, 114, and 120. The insulating layer 122 can be Si3N4, SiO2, SiON, Ta2O5, zinc oxide (ZnO), zircon (ZrO2), Al2O3, or other suitable dielectric material. The deposition of insulating layer 122 may involve lamination, spin coating, PVD, or CVD. Alternatively, an encapsulant or molding compound can be dispensed to encapsulate and provide environmental protection from external elements and contaminants. The encapsulant can be epoxy resin, epoxy acrylate, polymer, or polymer composite material. A portion of insulating layer 122 may be removed by grinding, CMP, or dry etching to expose stud bumps 120 for further electrical interconnection with other components. Stud bumps 112 and 120 are stacked two deep on contact pad 104 to create separation with respect to active region 105 and insulating layer 106 for bond wire 118 and stud bump 120.

Figure 3J:
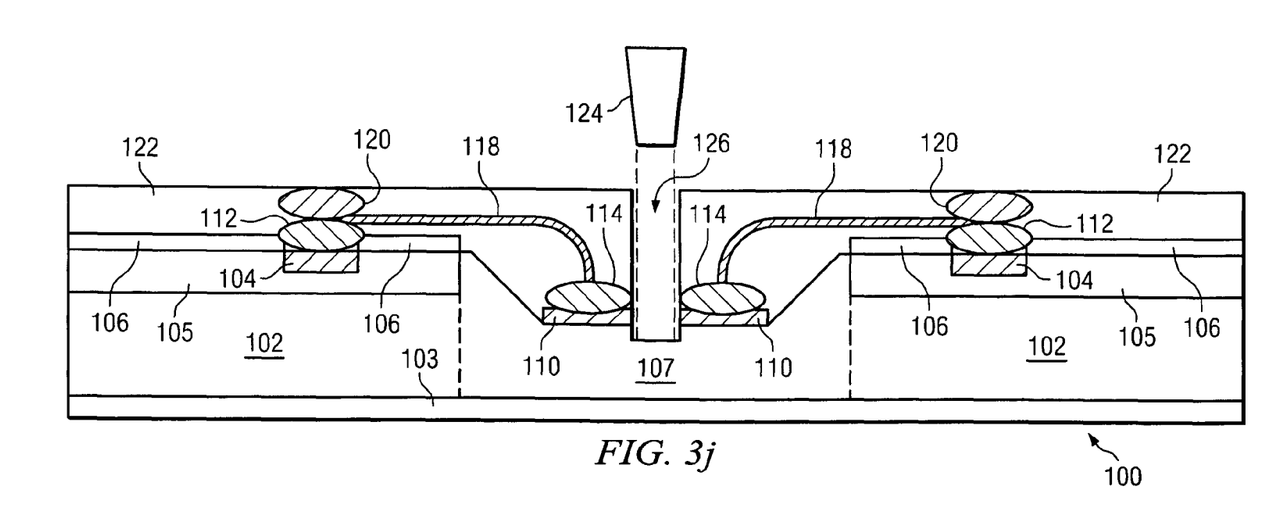

Wafer 100 undergoes partial dicing operation with saw blade or laser tool 124 to cut dicing channel 126 through saw street 107 between stud bumps 114, as shown in FIG. 3j. Dicing channel 126 extends through recessed region 108 and conductive layer 110 and partially into wafer base material 102. In this embodiment, dicing channel 126 does not extend completely through wafer base material 102. The width of dicing channel 126 is about 10-15 μm.

Figure 4:
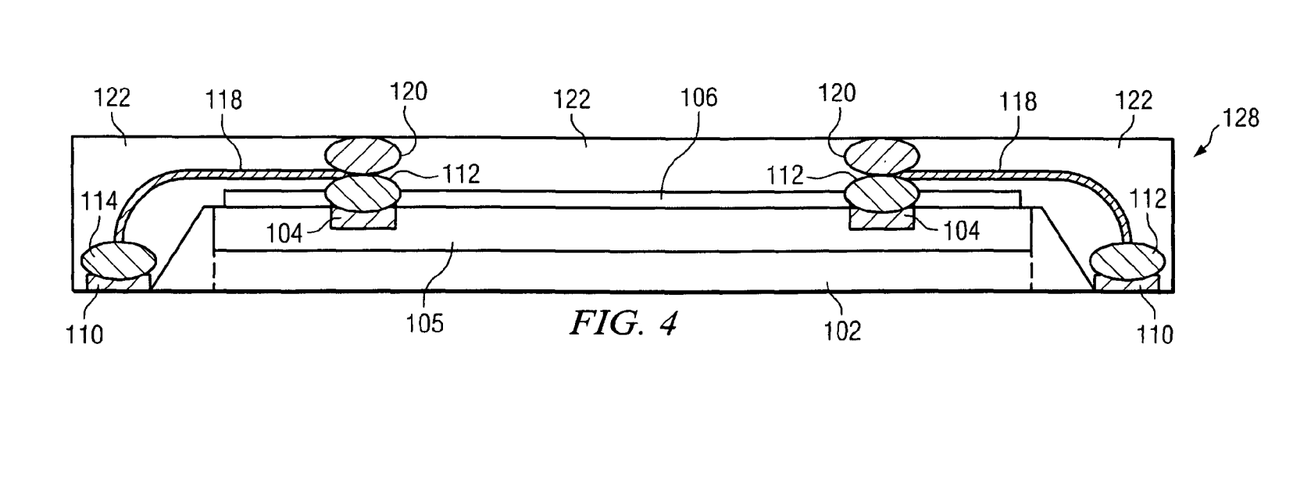
FIG. 4 illustrates the semiconductor device with bond wire and stud bumps formed in the recessed region of the peripheral area around the die.

Wafer 100 undergoes backgrinding to remove dicing tape 103 and a portion of bulk material 102 from a backside of wafer 100, opposite active region 105, least up to dicing channel 126. Plasma etching, CMP, wet etch, dry etch, or other wafer thinning process can also be used to remove the wafer bulk material. By backgrinding to dicing channel 126, wafer 100 is singulated into individual semiconductor devices 128, as shown in FIG. 4. The partial dicing followed by backgrinding to singulate wafer 100 eliminates the need for a thin wafer handler. The backgrinding process also exposes conductive layer 110 for electrical interconnection with other components.

Each semiconductor device 128 has bond wires 118 and stud bumps 112, 114, and 120 which electrically connect conductive layer 110 to contact pads 104 of active region 105. The exposed stud bumps 114 and 120 provide vertical electrical interconnection to other components in a package-in-package (PiP), package-on-package (PoP), or fan-in package on package (FiPoP) configuration.

Figure 5:
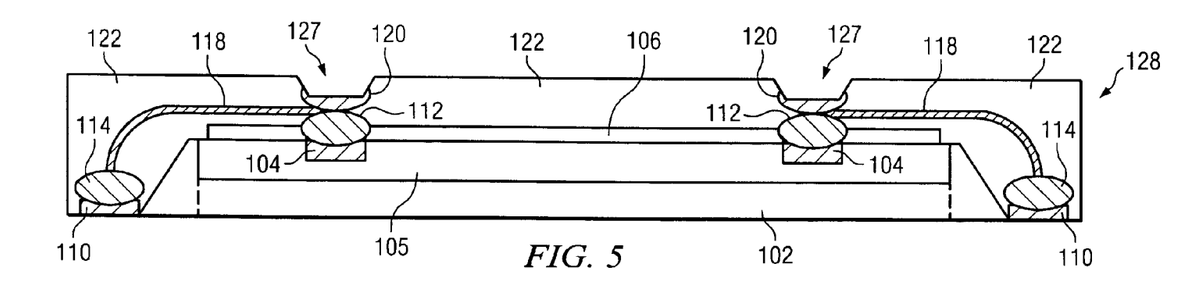
FIG. 5 illustrates the semiconductor device with a portion of the encapsulant and uppermost stud bump removed for efficient stacking of devices.

FIG. 5 shows the embodiment of semiconductor device 128 in FIG. 4 with a groove or notch 127 cut into stud bump 120 for making electrical connection to external components while reducing total stacked package height. Notch 127 also serves as an access point to contact pad 104 for testing purposes.

Figure 6:
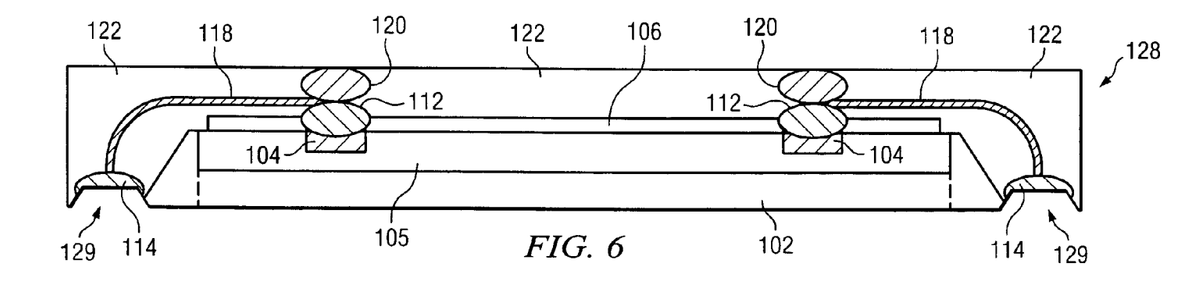
FIG. 6 illustrates the semiconductor device with a portion of the stud bump in the recessed region removed for efficient stacking of devices.

FIG. 6 shows the embodiment of semiconductor device 128 in FIG. 4 with a groove or notch 129 cut into stud bump 114 for making electrical connection to external components while reducing total stacked package height.

Figure 7:
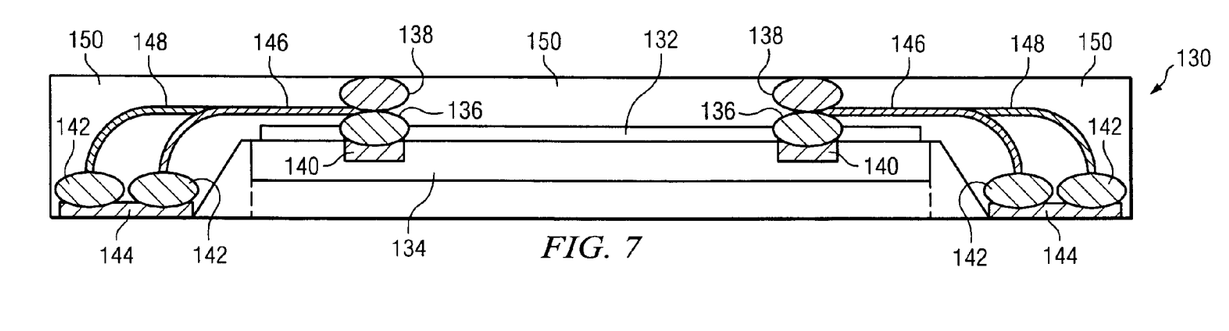
FIG. 7 illustrates the semiconductor device with multiple stud bumps formed in the recessed region.

In FIG. 7, semiconductor device 130 includes passivation layer 132 formed over active region 134, similar to FIG. 3a. A recessed region is formed in the saw street between the active regions, as described in FIG. 3b. Stud bumps 136 and 138 are stacked over contact pads 140 of active region 134, similar the embodiment of FIGS. 3b-3h. In this embodiment, multiple rows of stud bumps 142 are formed over conductive layer 144 in the recessed region for higher input/output (I/O) pin count for semiconductor device 130. The multiple rows of stud bumps 142 are formed as described in FIG. 3f. Stud bumps 142 can be organized in a zigzag pattern for higher interconnect density. Bond wires 146 and 148 electrically interconnect stud bumps 136, 138, and 142. An insulating layer 150 is formed over passivation layer 132, conductive layer 144, bond wires 146-148, and stud bumps 136, 138, and 142, similar to FIG. 3i. The insulating layer 150 can be Si3N4, SiO2, SiON, Ta2O5, ZnO, ZrO2, Al2O3, or other suitable dielectric material. The deposition of insulating layer 150 may involve lamination, spin coating, PVD, or CVD. Alternatively, an encapsulant or molding compound can be dispensed to encapsulate and provide environmental protection from external elements and contaminants. The encapsulant can be epoxy resin, epoxy acrylate, polymer, or polymer composite material. A portion of insulating layer 150 may be removed by grinding, CMP, or dry etching to expose stud bumps 138 for further electrical interconnection with other components.

The wafer undergoes partial dicing operation with a saw blade or laser tool to cut a dicing channel through the saw street between the multiple rows of stud bumps 142, similar to FIG. 3j. The dicing channel extends through the recessed region and conductive layer 144 and partially into the wafer base material. The wafer then undergoes backgrinding to remove a portion of the bulk material from a backside of the wafer, opposite active region 154, at least up to the dicing channel. Plasma etching, CMP, wet etch, dry etch, or other wafer thinning process can also be used to remove the wafer bulk material. The backgrinding process also exposes conductive layer 144 for electrical interconnection with other components.

Each semiconductor device 130 has bond wires 146-148 and stud bumps 136, 138, and 142 which electrically connect conductive layer 144 to contact pads 144 of active regions 134. The exposed stud bumps 138 and 142 provide vertical electrical interconnection to other components in PiP, PoP, or FiPoP configuration.

Figure 8:
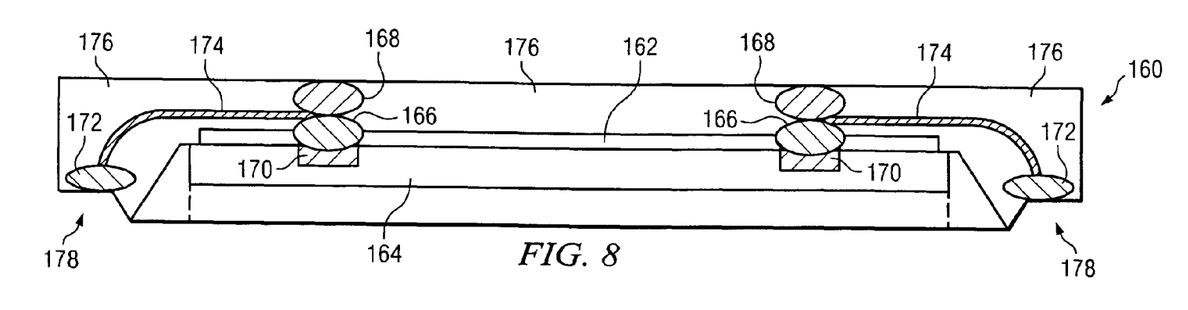
FIG. 8 illustrates the semiconductor device with an elevated stud bump in the recessed region.

In FIG. 8, semiconductor device 160 includes passivation layer 162 formed over active region 164, similar to FIG. 3a. A recessed region is formed in the saw street between the active regions. Stud bumps 166 and 168 are stacked over contact pad 170 of active region 164, similar to the embodiment of FIGS. 3b-3h. In this embodiment, stud bumps 172 are formed on an elevated surface in the recessed region. The elevated surface may be wafer base material. Bond wires 174 electrically interconnect stud bumps 166, 168, and 172. An insulating layer 176 is formed over passivation layer 162, bond wires 174, and stud bumps 166, 168, and 172, similar to FIG. 3i. The insulating layer 176 can be Si3N4, SiO2, SiON, Ta2O5, ZnO, ZrO2, Al2O3, or other suitable dielectric material. The deposition of insulating layer 176 may involve lamination, spin coating, PVD, or CVD. Alternatively, an encapsulant or molding compound can be dispensed to encapsulate and provide environmental protection from external elements and contaminants. The encapsulant can be epoxy resin, epoxy acrylate, polymer, or polymer composite material. A portion of insulating layer 176 may be removed by grinding, CMP, or dry etching to expose stud bumps 168 for further electrical interconnection with other components.

The wafer undergoes partial dicing operation with a saw blade or laser tool to cut a dicing channel through the saw street between stud bumps 172, similar to FIG. 3j. The dicing channel extends through the recessed region and partially into the wafer base material. The wafer then undergoes backgrinding to remove a portion of the bulk material from a backside of the wafer, opposite active region 164, at least up to the dicing channel. Plasma etching, CMP, wet etch, dry etch, or other wafer thinning process can also be used to remove the wafer bulk material. A notch 178 is formed in the wafer base material of the recessed region to expose a backside of stud bumps 172.

Each semiconductor device 160 has bond wires 174 and stud bumps 166, 168, and 172 which electrically connect to contact pads 170 of active regions 164. The exposed stud bumps 168 and 172 provide vertical electrical interconnection to other components in PiP, PoP, or FiPoP configuration.

Figure 9:
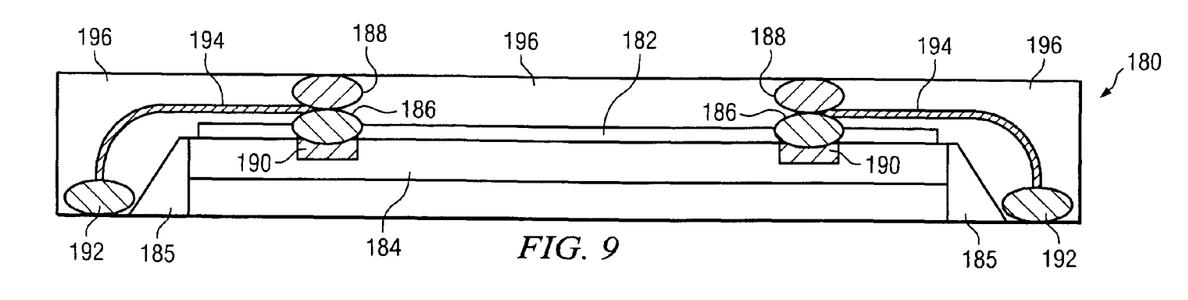
FIG. 9 illustrates the semiconductor device with organic material formed in the peripheral area.

In FIG. 9, semiconductor device 180 includes passivation layer 182 formed over active region 184, similar to FIG. 3a. A recessed region is formed in the saw street between the active regions. In this embodiment, the recessed region is formed using organic material 185 in the peripheral area. Organic material 185 provides flexible I/O pin count. Stud bumps 186 and 188 are stacked over contact pad 190 of active region 184, similar to the embodiment of FIGS. 3b-3h. Stud bumps 192 are formed on organic material 185. Bond wires 194 electrically interconnect stud bumps 186, 188, and 192. An insulating layer 196 is formed over passivation layer 182, bond wires 194, and stud bumps 186, 188, and 192, similar to FIG. 3i. The insulating layer 196 can be Si3N4, SiO2, SiON, Ta2O5, ZnO, ZrO2, Al2O3, or other suitable dielectric material. The deposition of insulating layer 196 may involve lamination, spin coating, PVD, or CVD. Alternatively, an encapsulant or molding compound can be dispensed to encapsulate and provide environmental protection from external elements and contaminants. The encapsulant can be epoxy resin, epoxy acrylate, polymer, or polymer composite material. A portion of insulating layer 196 may be removed by grinding, CMP, or dry etching to expose stud bumps 188 for further electrical interconnection with other components.

The wafer undergoes partial dicing operation with a saw blade or laser tool to cut a dicing channel through the saw street between stud bumps 192, similar to FIG. 3j. The dicing channel extends through the recessed region, organic material 185, and partially into the wafer base material. The wafer then undergoes backgrinding to remove a portion of the bulk material from a backside of the wafer, opposite active region 184, at least up to the dicing channel. Plasma etching, CMP, wet etch, dry etch, or other wafer thinning process can also be used to remove the wafer bulk material. The backgrinding process also exposes a backside of stud bumps 192 for electrical interconnection with other components.

Each semiconductor device 180 has bond wire 194 and stud bumps 186, 188, and 192 which electrically connect to contact pads 190 of active regions 184. The exposed stud bumps 188 and 192 provide vertical electrical interconnection to other components in PiP, PoP, or FiPoP configuration.

Figure 10:
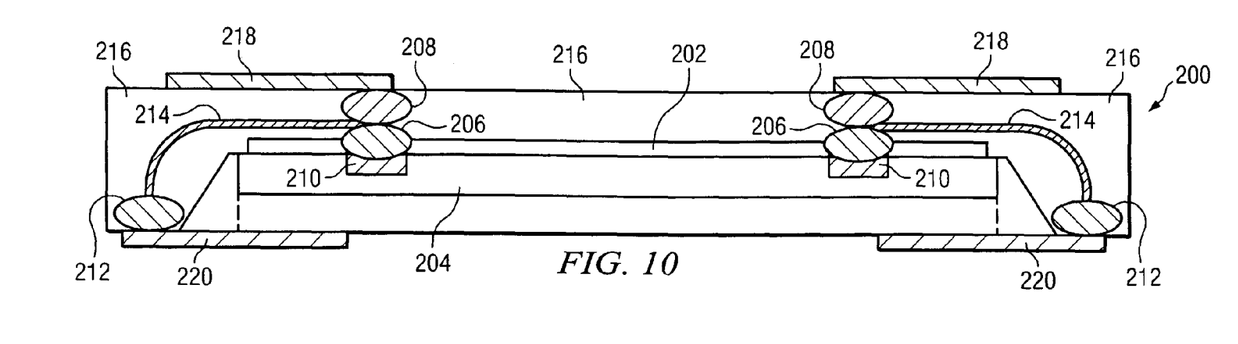
FIG. 10 illustrates the semiconductor device with top-side RDL and backside RDL electrically connected to the stud bumps.

In FIG. 10, semiconductor device 200 includes passivation layer 202 formed over active region 204, similar to FIG. 3a. A recessed region is formed in the saw street between the active regions. Stud bumps 206 and 208 are stacked over contact pad 210 of active region 204, similar the embodiment of FIGS. 3b-3h. Stud bumps 212 are formed in the recessed region, similar to FIG. 3f. Bond wires 214 electrically interconnect stud bumps 206, 208, and 212. An insulating layer 216 is formed over passivation layer 202, bond wires 214, and stud bumps 206, 208, and 212, similar to FIG. 3i. The insulating layer 216 can be Si3N4, SiO2, SiON, Ta2O5, ZnO, ZrO2, Al2O3, or other suitable dielectric material. The deposition of insulating layer 216 may involve lamination, spin coating, PVD, or CVD. Alternatively, an encapsulant or molding compound can be dispensed to encapsulate and provide environmental protection from external elements and contaminants. The encapsulant can be epoxy resin, epoxy acrylate, polymer, or polymer composite material. A portion of insulating layer 216 may be removed by grinding, CMP, or dry etching to expose stud bumps 208 for further electrical interconnection with other components.

An electrically conductive layer 218 is patterned and deposited over insulating layer 216 using PVD, CVD, sputtering, evaporation, electrolytic plating, electroless plating, screen printing, or other suitable metal deposition process. The conductive layer 218 can be Al, Cu, Sn, Ni, Au, Ag, or other suitable material. Conductive layer 218 electrically connects to stud bumps 208 as a top-side redistribution layer (RDL).

The wafer undergoes partial dicing operation with a saw blade or laser tool to cut a dicing channel through the saw street between stud bumps 212, similar to FIG. 3j. The dicing channel extends through the recessed region and partially into the wafer base material. The wafer then undergoes backgrinding to remove a portion of the bulk material from a backside of the wafer, opposite active region 204, least up to the dicing channel. Plasma etching, CMP, wet etch, dry etch, or other wafer thinning process can also be used to remove the wafer bulk material. The backgrinding process also exposes a backside of stud bumps 212.

An electrically conductive layer 220 is patterned and deposited over the backside of stud bumps 212 and the wafer base material using PVD, CVD, sputtering, evaporation, electrolytic plating, electroless plating, screen printing, or other suitable metal deposition process. The conductive layer 220 can be Al, Cu, Sn, Ni, Au, Ag, or other suitable material. Conductive layer 220 electrically connects to stud bumps 212 as a backside RDL.

Each semiconductor device 200 has bond wire 214 and stud bumps 206, 208, and 212 which electrically connect to contact pads 210 of active regions 204. The exposed stud bumps 208 and 212 and RDLs 218 and 220 provide vertical electrical interconnection to other components in PiP, PoP, or FiPoP configuration.

Figure 11:
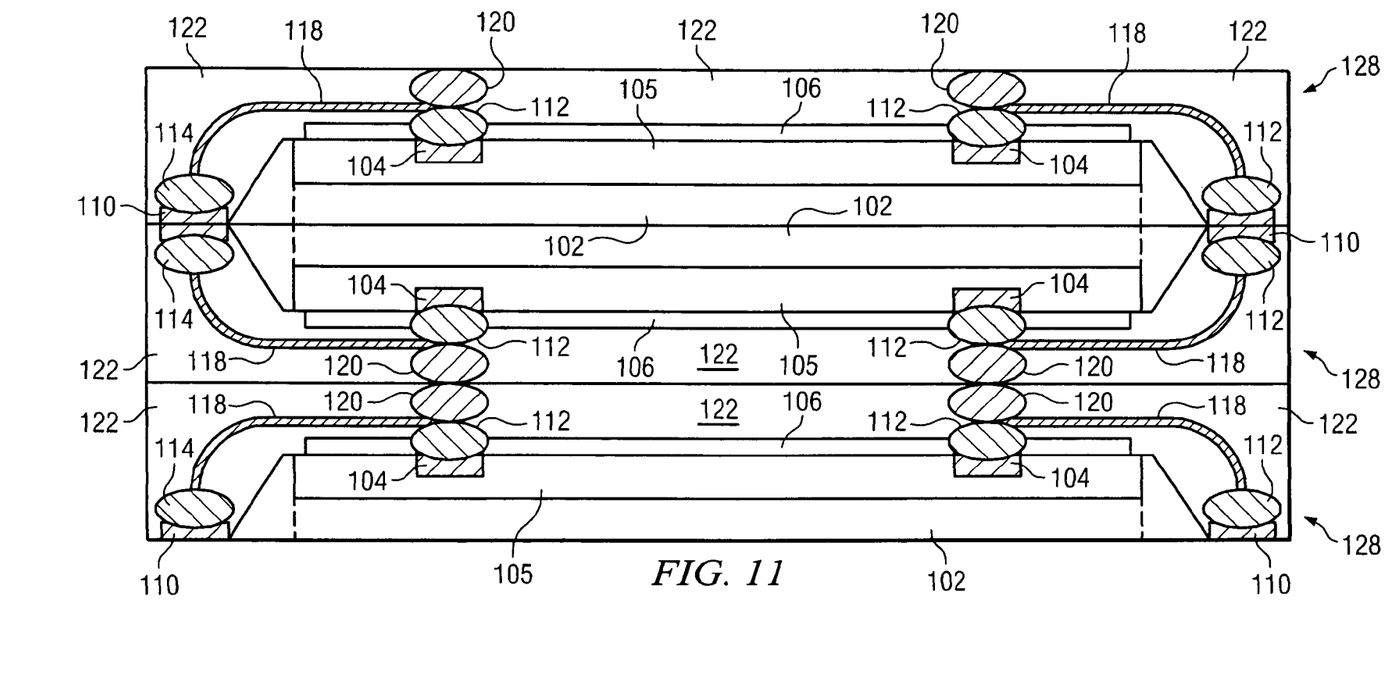
FIG. 11 illustrates two stacked semiconductor devices electrically interconnected through the bond wires and stud bumps.

FIG. 11 shows two stacked semiconductor devices 128 from FIG. 4. The stacked semiconductor devices 128 are electrically interconnected through bond wires 118 and stud bumps 112, 114, and 120.

Figure 12:
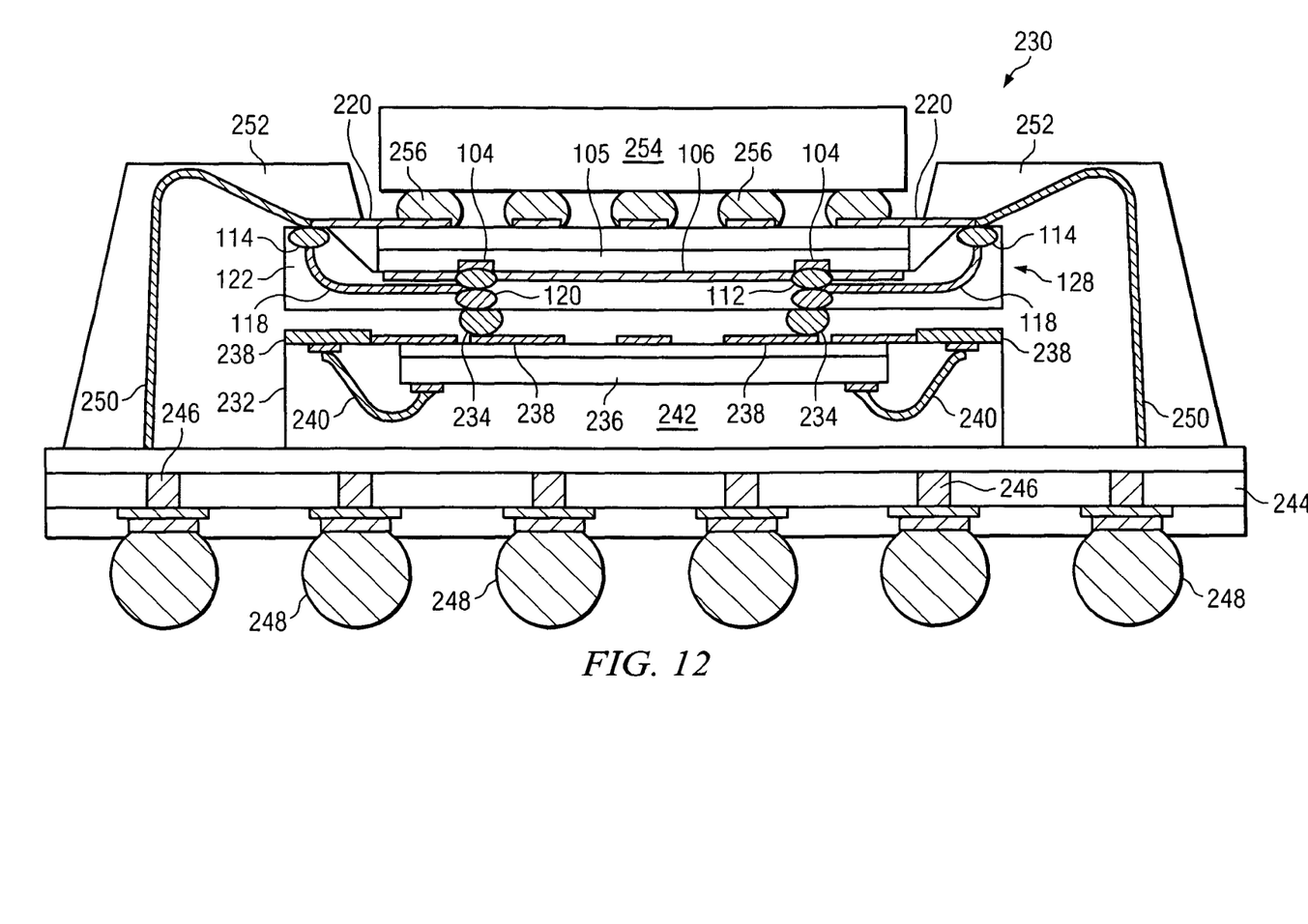
FIG. 12 illustrates a FiPoP package with components interconnected through the bond wires and stud bumps.

The aforedescribed semiconductor die 128 with bond wires 118 and stud bumps 112, 114, and 120 can be readily integrated into FiPoP 230, as shown in FIG. 12. Semiconductor device 128 with backside RDL 220 from FIG. 10 is mounted to semiconductor device 232 by way of solder bumps 234. Semiconductor device 232 includes semiconductor die 236 electrically connected to interconnect structure 238 through bond wires 240. An encapsulant 242 covers semiconductor die 236. Semiconductor device 232 is mounted to substrate 244 which has an interconnect structure 246 and solder bumps 248 for electrical interconnect to external devices. The top-side RDL 220 is electrically connected to interconnect structure 246 through bond wires 250. A molding compound or encapsulant 252 is deposited over semiconductor devices 128 and 232 using dedicated mold chase design. Encapsulant 252 can be made with epoxy acrylate or other polymer material and applied by transfer molding, liquid encapsulant molding, or other molding process. Encapsulant 252 is non-conductive and environmentally protects the semiconductor device from external elements and contaminants.

The stacked semiconductor devices 128, 232, and 254 are electrically interconnected through bond wire 118 and stud bumps 112, 114, and 120. For example, semiconductor die 254 is electrically connected through solder bumps 256, RDL 220, bond wire 118, and stud bumps 112, 114, and 120 to contact pads 104 in active region 105. Likewise, semiconductor devices 128 and 232 electrically connect through interconnect structure 238, bond wires 240, solder bumps 234, bond wire 118, and stud bumps 112, 114, and 120 to interconnect structure 246.

The interconnect structure of semiconductor device 120, including bond wire 118 and stud bumps 112, 114, and 120, can also be integrated into PiP and PoP arrangements.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer having a plurality of semiconductor die with a peripheral area around the semiconductor die;
    forming a recessed region in the peripheral area, the recessed region having an angled or vertical sidewall;
    forming a first conductive layer in the recessed region;
    forming a first stud bump over a contact pad of the semiconductor die;
    forming a second stud bump over the first conductive layer within the recessed region;
    forming a bond wire between the first and second stud bumps;
    forming a third stud bump over the bond wire, and first stud bump;
    forming an encapsulant over the first conductive layer, bond wire, and first, second, and third stud bumps;
    forming a dicing channel partially through the peripheral area; and
    removing a portion of a backside of the semiconductor wafer to the dicing channel to singulate the semiconductor wafer, and separate the semiconductor die while leaving the second stud bump and the first conductive layer embedded within the encapsulant.

2. The method of claim 1, further including:
    forming a plurality of stud bumps in the recessed region; and
    forming the dicing channel between the plurality of stud bumps.

3. The method of claim 1, further including:
    removing a portion of the second stud bump; and
    removing a portion of the third stud bump.

4. The method of claim 1, further including:
    forming the second stud bump on an elevated surface of the recessed region; and
    forming a notch in the semiconductor wafer to expose the second stud bump.

5. The method of claim 1, further including depositing organic material in the peripheral area.

6. The method of claim 1, further including:
    forming a second conductive layer over the encapsulant, the second conductive layer being electrically connected to the third stud bump; and
    forming a third conductive layer over a backside of the semiconductor die, the third conductive layer being electrically connected to the second stud bump.

7. The method of claim 1, further including disposing the semiconductor die with the bond wire and first, second, and third stud bumps in a semiconductor package with other semiconductor components, the semiconductor die being electrically interconnected to the other semiconductor components through the bond wire and second or third stud bumps.

8. A method of making a semiconductor device, comprising:
    providing a semiconductor wafer having a plurality of semiconductor die with a peripheral area around the semiconductor die;
    forming a recessed region in the peripheral area;
    forming a conductive layer in the recessed region;
    forming a first stud bump over a contact pad of the semiconductor die;
    forming a second stud bump over the conductive layer within the recessed region;
    forming a bond wire between the first and second stud bumps;
    forming an encapsulant over the conductive layer, bond wire, and first and second stud bumps; and
    singulating the semiconductor wafer through the peripheral area to separate the semiconductor die with the second stud bump and the first conductive layer embedded within the encapsulant.

9. The method of claim 8, wherein the recessed region has an angled or vertical sidewall.

10. The method of claim 8, further including forming a third stud bump over the bond wire and first stud bump.

11. The method of claim 8, wherein singulating the semiconductor wafer includes:
    forming a dicing channel partially through the peripheral area; and
    removing a portion of a backside of the semiconductor wafer to the dicing channel to singulate the semiconductor wafer and separate the semiconductor die.

12. The method of claim 8, further including:
    forming a plurality of stud bumps in the recessed region; and
    forming the dicing channel between the plurality of stud bumps.

13. The method of claim 8, further including disposing the semiconductor die with the bond wire and first and second stud bumps in a semiconductor package with other semiconductor components, the semiconductor die being electrically interconnected to the other semiconductor components through the bond wire and second stud bumps.

14. The method of claim 8, further including stacking a plurality of the semiconductor die, the semiconductor die being electrically connected through the bond wire and second stud bumps.

15. A method of making a semiconductor device, comprising:
    providing a semiconductor wafer having a plurality of semiconductor die with a peripheral area around the semiconductor die;
    forming a recessed region in the peripheral area;
    forming a first stud bump over a contact pad of the semiconductor die;
    forming a second stud bump within the recessed region;
    forming a bond wire between the first and second stud bumps;
    forming an encapsulant over the bond wire, and first and second stud bumps; and
    singulating the semiconductor wafer through the peripheral area to separate the semiconductor die with the second stud bump embedded within the encapsulant.

16. The method of claim 15, further including forming a conductive layer in the recessed region prior to forming the second stud bump.

17. The method of claim 15, further including forming a third stud bump over the bond wire and first stud bump.

18. The method of claim 17, further including forming an encapsulant over the bond wire and first, second, and third stud bumps.

19. The method of claim 15, wherein singulating the semiconductor wafer includes:
   forming a dicing channel partially through the peripheral area; and
   removing a portion of a backside of the semiconductor wafer to the dicing channel to singulate the semiconductor wafer and separate the semiconductor die.

20. The method of claim 15, further including:
   forming a plurality of stud bumps in the recessed region; and
   forming the dicing channel between the plurality of stud bumps.

21. The method of claim 15, further including disposing the semiconductor die with the bond wire and first and second stud bumps in a semiconductor package with other semiconductor components, the semiconductor die being electrically interconnected to the other semiconductor components through the bond wire and second stud bumps.

22. The method of claim 15, further including stacking a plurality of the semiconductor die, the semiconductor die being electrically connected through the bond wire and second stud bumps.

23. A method of making a semiconductor device, comprising:
   providing a semiconductor wafer having a plurality of semiconductor die;
   forming a recessed region in a peripheral area of the semiconductor die;
   forming a first stud bump over the semiconductor die;
   forming a second stud bump within the recessed region;
   forming a bond wire between the first and second stud bumps;
   forming an encapsulant over the bond wire, and first and second stud bumps; and
   singulating the semiconductor wafer with the second stud bump embedded within the encapsulant.

24. The method of claim 23, further including forming a conductive layer in the recessed region prior to forming the second stud bump.

25. The method of claim 23, wherein forming a second stud bump within the recessed region further includes:
   forming multiple rows of second stud bumps in the recessed region; and
   forming the dicing channel between the multiple rows of second stud bumps.

* * * * *